United States Patent [19]
Hong

[11] Patent Number: 5,972,747
[45] Date of Patent: Oct. 26, 1999

[54] METHOD OF FABRICATING SEMICONDUCTOR MEMORY DEVICE

[75] Inventor: Ki-Gak Hong, Cheongju-si, Rep. of Korea

[73] Assignee: LG Semicon Co., Ltd., Chungcheongbuk-do, Rep. of Korea

[21] Appl. No.: 08/931,449

[22] Filed: Sep. 16, 1997

[30] Foreign Application Priority Data

Dec. 31, 1996 [KR] Rep. of Korea ........................ 96-79244

[51] Int. Cl.⁶ .............................................. H01L 21/8242
[52] U.S. Cl. ........................................... 438/253; 438/251
[58] Field of Search ..................................... 438/238–252, 438/253–256, 390–396, 381–389

[56] References Cited

U.S. PATENT DOCUMENTS 5,352,623  10/1994  Kamiyama .

*Primary Examiner*—Jey Tsai
*Attorney, Agent, or Firm*—Morgan, Lewis & Bockius LLP

[57] ABSTRACT

A semiconductor memory device includes a semiconductor substrate, a cell array region storing data on the substrate, a periphery circuit region on the substrate, the periphery circuit region controlling input and output of the data stored in the cell, a plurality of word-lines and bit-lines on the cell array region, and a plurality of dummy pattern layers on the periphery circuit region.

12 Claims, 15 Drawing Sheets

F I G. 2G
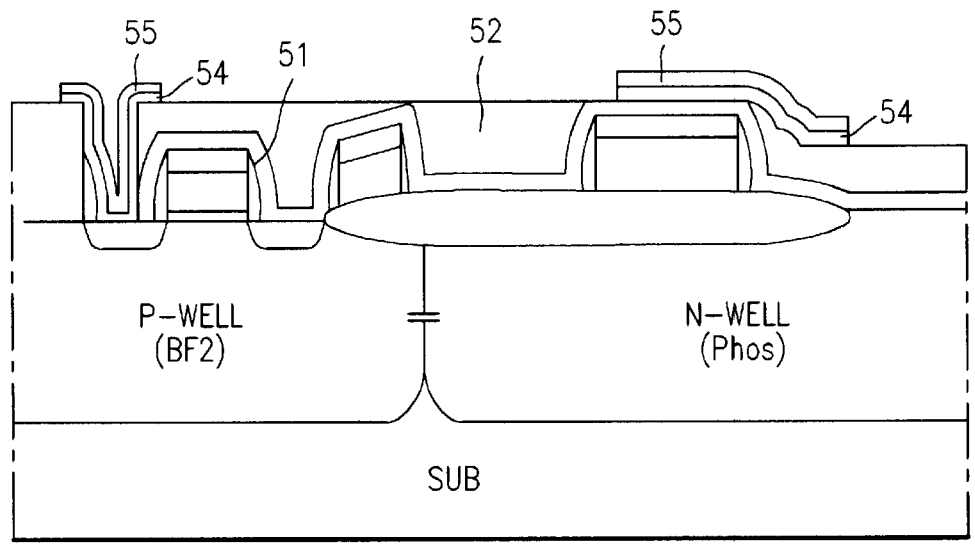
F I G. 2H
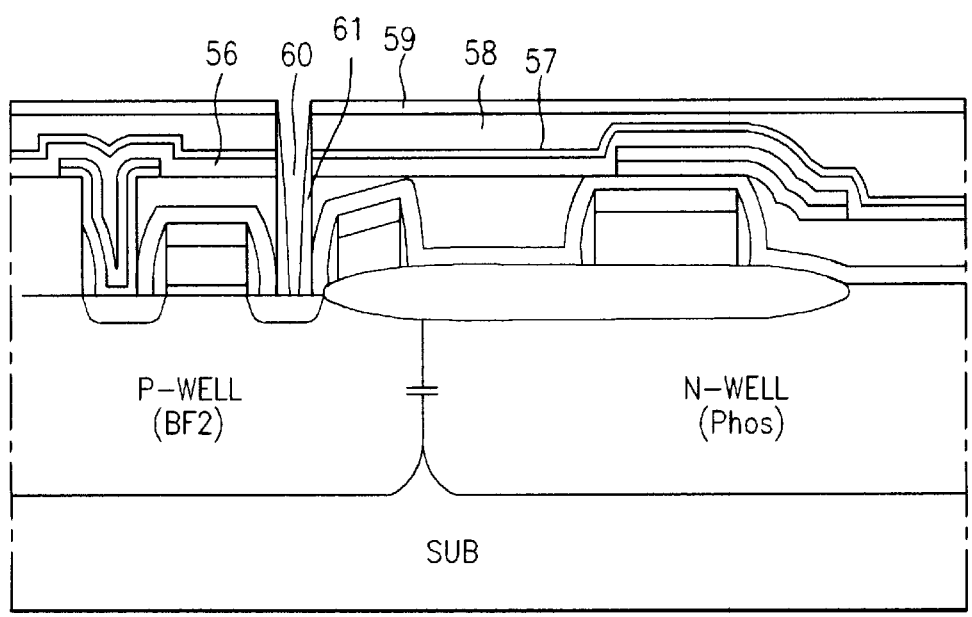

F I G. 2L
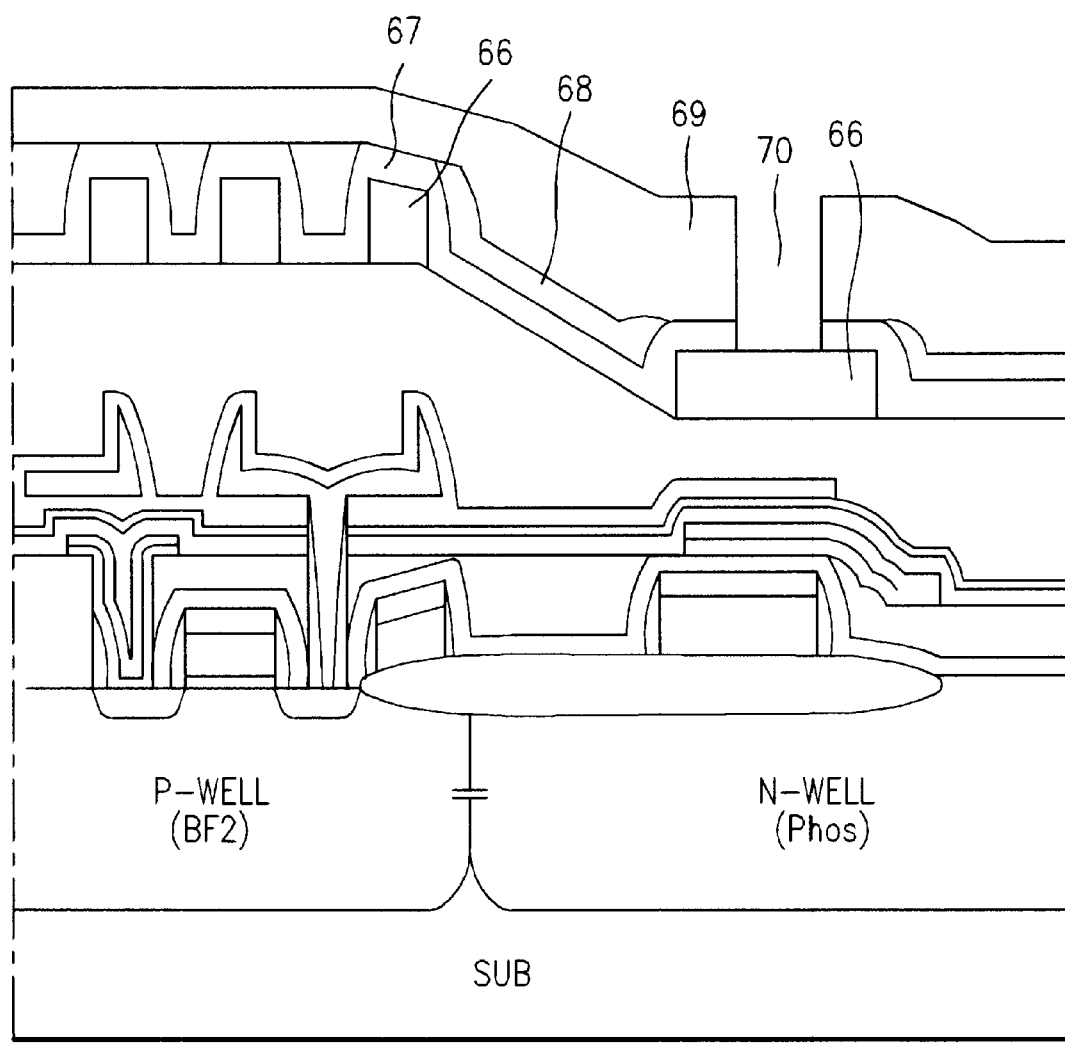

METHOD OF FABRICATING SEMICONDUCTOR MEMORY DEVICE

This application claims the benefit of Korean Application No. 79244/1996 filed on Dec. 31, 1996, which is hereby incorporated by reference.

BACKGROUND OF THE INVENTION

1. Field of the Invention

The present invention relates to a semiconductor device, and more particularly, to a semiconductor memory device and a method of fabricating the same. Although the present invention is suitable for a wide scope of applications, it is particularly suitable for reducing a step coverage between a cell part and a periphery circuit part for a higher integrated semiconductor memory device.

2. Discussion of the Related Art

A conventional semiconductor memory device and a method of fabricating the same will be explained with reference to the accompanying drawings.

FIGS. 1A to 1M are cross-sectional views showing a conventional method of fabricating the semiconductor memory device.

An n-type well and a p-type well are formed in a semiconductor substrate, as shown in FIG. 1A.

In FIG. 1B, an isolation layer 4 for isolating a cell part from a periphery circuit part and a device isolation layer 3 for isolating a cell from one another are formed on predetermined portions of the substrate where the n-type well and the p-type well have been formed.

Subsequently, as shown in FIG. 1C, an ion implantation process is performed into an active region defined by the device isolation layer 3 and the isolation layer 4, in order to adjust a threshold voltage. At this time, the type of transistor, such as an NMOS or a PMOS transistor, determines the types of ions to be implanted.

Next, as shown in FIG. 1D, a word-line of a memory device is formed in the cell part. At this time, a gate is formed in the cell part as well as in the periphery circuit part. The word-line includes a gate insulating layer 5, a polygate 6, and a cap oxide layer 7 on the substrate.

Thereafter, as shown in FIG. 1E, a buffer oxide layer 8 is formed on the substrate excluding the cell transistor. The buffer oxide layer 8 serves to relieve stress imposed over the substrate during the ion implantation process. With the gate serving as a mask, ions are implanted to form lightly-doped impurity diffusion regions 9 for a source and a drain.

Then, a sidewall oxide layer 10 is formed on both sides of the gates, as shown in FIG. 2F. With the sidewall oxide layer 10 and gate serving as masks, an ion implantation process is carried out to form heavily-doped impurity diffusion regions having a lightly doped drain (LDD) structure. A first insulating layer 11 is then formed on the entire surface of the substrate where the cell transistors have been formed. Subsequently, a second insulating layer 12 made of boron phosphorus silicate glass (BPSG) is formed on the first insulating layer 11. Next, the first and second insulating layers 11 and 12 are selectively removed to form a bit-line contact hole 13.

In FIG. 1G, a polysilicon layer 14 doped with n-type impurity ions and a tungsten silicide layer 15 are deposited to completely bury the bit-line contact hole 13 and then selectively patterned to form a bit-line.

Thereafter, as shown in FIG. 1H, a third insulating layer 16 made of oxide is formed on the entire surface including the bit-line. A fourth insulating layer 17 made of nitride is deposited on the third insulating layer 16. Thereafter, a fifth insulating layer 18 made of BPSG is formed on the fourth insulating layer 17. Then, a sixth insulating layer 19 of oxide is formed on the fifth insulating layer 18. The insulating layers 19, 18, 17, 16, 12, and 11 at the other side of the cell transistor are partially removed to form storage node contact holes 20. Subsequently, a nitride sidewall 21 is formed on side surface of each of the storage node contact holes 20.

Next, as shown in FIG. 1I, storage node electrodes 22 are formed to respectively contact the impurity diffusion regions exposed by the storage node contact holes 20 at the other side of the cell transistor, and then the fifth and sixth insulating layers 18 and 19 are removed with wet-etching. A high dielectric layer 23 is then formed on the entire surface including the storage node electrodes 22.

Thereafter, as shown in FIG. 1J, a plate electrode 24 is formed on the storage node electrode 22 where the high dielectric layer 23 has already been formed.

Then, as shown in FIG. 1K, a seventh insulating layer 25 of oxide is formed on the entire surface including the cell transistor and capacitor for multi-wirings. Aluminum and anti-reflection layers are formed on the seventh insulating layer 25 and then selectively etched to form lower wiring layers 26. At this time, transistors and wiring layers are also formed in the periphery circuit part.

Next, as shown in FIG. 1L, an interlayer insulating layer 27 is formed on the entire surface including the lower wiring layers 26, and then a spin on glass (SOG) layer 28 is coated on the interlayer insulating layer 27. The interlayer insulating layer 27 is then etched-back to improve the step coverage of the device. Subsequently, an eighth insulating layer 29 of oxide is formed on the SOG layer 28. An interlayer contact hole 30 is formed by removing the eighth insulating layer 29, the SOG layer 28 and the interlayer insulating layer 27 to expose the lower wiring layer 26 over the periphery circuit region.

In FIG. 1M, a plug layer 31 is formed in the interlayer contact hole 30 to improve the electrical characteristics of wirings. Then, an upper wiring layer 32 made of aluminum and anti-reflection layer is formed to contact the plug layer 31.

The above-mentioned method has been used for mass production of DRAM devices having a capacitor over bit-line (COB) structure. However, in the conventional method, defective devices are frequently produced due to electrical short circuit in metal wirings in realizing high integration and super micronization. In particular, the main cause of the short circuit is caused by the step coverage between a cell part where a cell array is constructed and a periphery circuit part where periphery circuits are formed in the device. The periphery circuits controls the input and output of data by applying signals to word-lines and data lines in the cell part. Since capacitors are formed to store data in the cell part, a step coverage is generated by forming the cell part and the periphery circuit part.

Accordingly, the conventional semiconductor memory device and the method of fabricating the same have the following problems.

Due to the step coverage between a cell part and a periphery circuit part, the short circuit in metal wirings is frequently occurred in the devices. Specifically, this result from the metal wirings of the cell part positioned higher than those of the periphery circuit part and insulating layers (the eighth insulating layer 29, the SOG layer 28, and the interlayer insulating layer 27) that are not precisely defined in a photolithography process. Moreover, the SOG layer exposed in a middle portion of an interlayer contact hole absorbs moisture into the interlayer contact hole and corrodes the plug layer. As a result, the electrical characteristics of the upper and lower wirings is deteriorated.

SUMMERY OF THE INVENTION

Accordingly, the present invention is directed to a semiconductor memory device and a method of fabricating the same that substantially obviate one or more of problems due to limitations and disadvantages of the related art.

An object of the invention is to provide a semiconductor memory device and a method of fabricating the same suitable for reducing a step coverage between a cell part and a periphery circuit part in the semiconductor memory device having a multi-wiring structure.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor memory device having a cell array region for storing data and a periphery circuit region for controlling input and output of the stored data includes word-lines and bit-lines on the cell array region, so as to be connected to cells of the cell array region; and dummy pattern layers formed on the periphery circuit region adjacent to the cell array region, so as to reduce step coverage between the cell array region and the periphery circuit region.

In another aspect, the semiconductor memory device, includes a semiconductor substrate, a cell array region storing data on the substrate, a periphery circuit region on the substrate, the periphery circuit region controlling input and output of the data stored in the cell, a plurality of word-lines and bit-lines on the cell array region, and a plurality of dummy pattern layers on the periphery circuit region.

In another aspect, the semiconductor memory cell having a capacitor over bit-lines (COB) structure includes a semiconductor substrate, a cell array region and a periphery circuit region on the substrate, a plurality of word-lines on the cell array region, impurity diffusion regions in the semiconductor substrate at both sides of each word-line, a plurality of word-line dummy pattern layers on the periphery circuit region adjacent to the cell array, a first insulating layer on the semiconductor substrate including the word-lines and word-line dummy pattern layers, the first insulating layer having contact holes over one of the impurity diffusion regions, a bit-line contacting the one of the impurity diffusion regions on the first insulating layer, a bit-line dummy pattern layer on the first insulating layer over the word-line dummy pattern layers, a second insulating layer formed on the first insulating layer inclusive of the bit-line and bit-line dummy pattern layer, a capacitor having an electrode on the second insulating layer, the electrode contacting the impurity diffusion region and the capacitor being over the bit-lines, a third insulating layer on the second insulating layer a including the capacitor, and a plurality of metal wirings on the third insulating layer.

In another aspect, the method of fabricating a semiconductor memory device having a semiconductor substrate, the method includes the steps of forming a plurality of isolation layers on the semiconductor substrate, the isolation layers isolating a cell from other cells and a cell array region from a periphery circuit region, forming a plurality of word-lines on the cell array region and the periphery circuit region, forming first and second impurity diffusion regions on the semiconductor substrate, forming first and second bit-lines over the cell array region and the periphery circuit region, respectively, the first bit-line contacting the first impurity diffusion region, forming an insulting layer on an entire surface including the bit-lines, forming a contact hole to expose the second impurity diffusion region, and forming a capacitor to contact the second impurity diffusion region.

In a further aspect, the method of fabricating a semiconductor memory device having a semiconductor substrate, the method includes the steps of forming first and second conductivity type wells in the semiconductor substrate, forming a first isolation layer on the first conductivity type well and a second conductivity type well at a boundary of the first and second conductivity type wells, implanting first impurity ions into the wells, forming a plurality of word-lines on the wells including the second isolation layer, implanting second impurity ions into the wells to define first and second impurity regions, forming a first bit-line to contact the first impurity region and a second bit-line at the second isolation layer, forming a first insulating layer on an entire surface of the substrate including the first and second bit-lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 2A to 2M are cross-sectional views showing the process steps of fabricating the semiconductor memory device according to a preferred embodiment of the present invention.

DETAILED DESCRIPTION OF THE PREFERRED EMBODIMENTS

Reference will now be made in detail to the preferred embodiments of the present invention, examples of which are illustrated in the accompanying drawings.

Figure 1A:
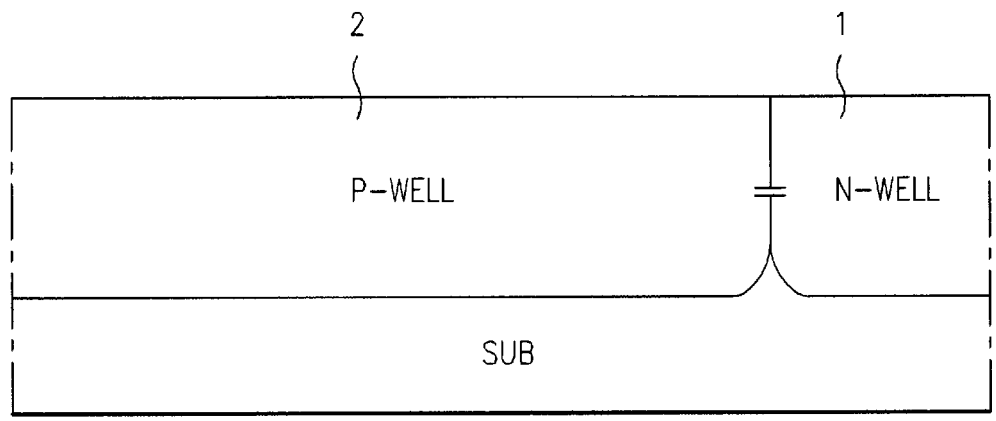
FIGS. 1A to 1M are cross-sectional views showing the process steps of fabricating a conventional semiconductor memory device.
Figure 1B:
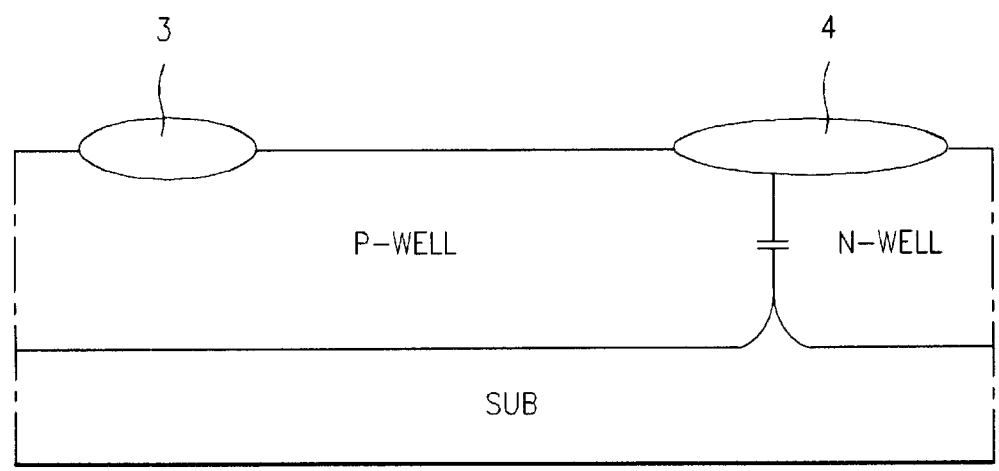
Figure 1C:
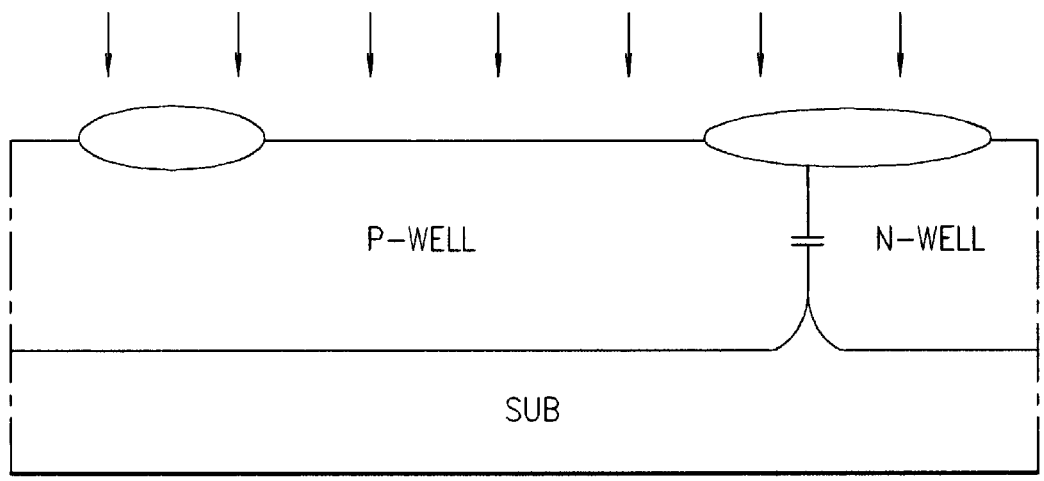
Figure 1D:
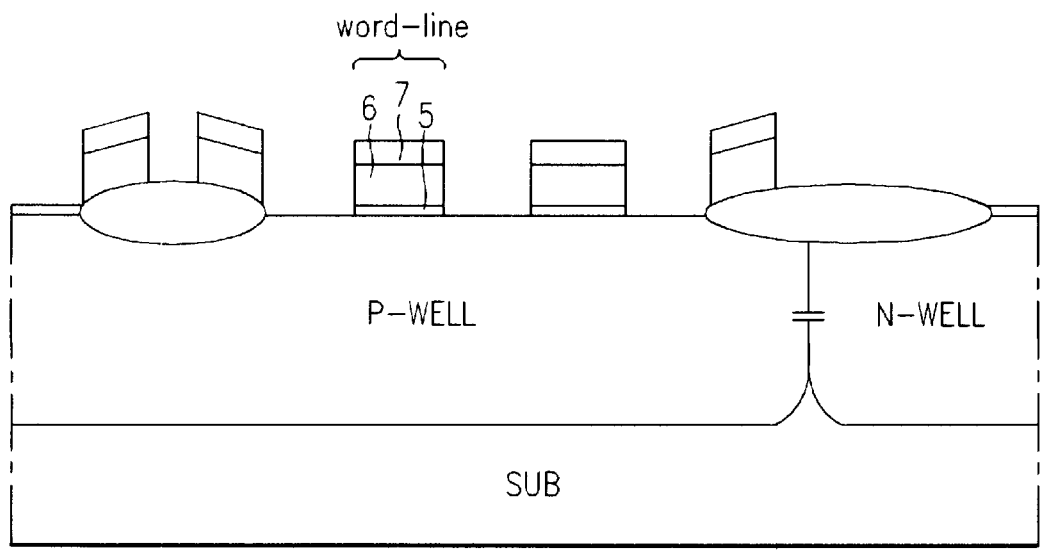
Figure 1E:
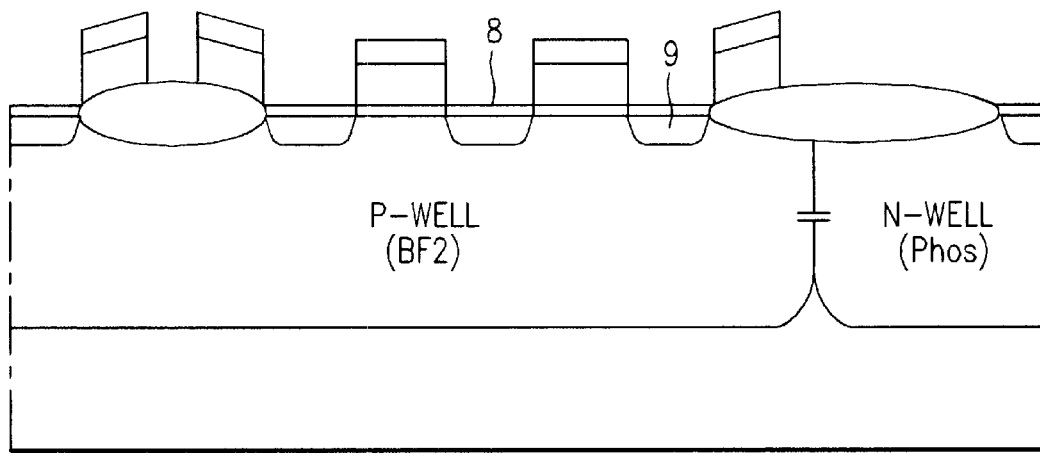
Figure 1F:
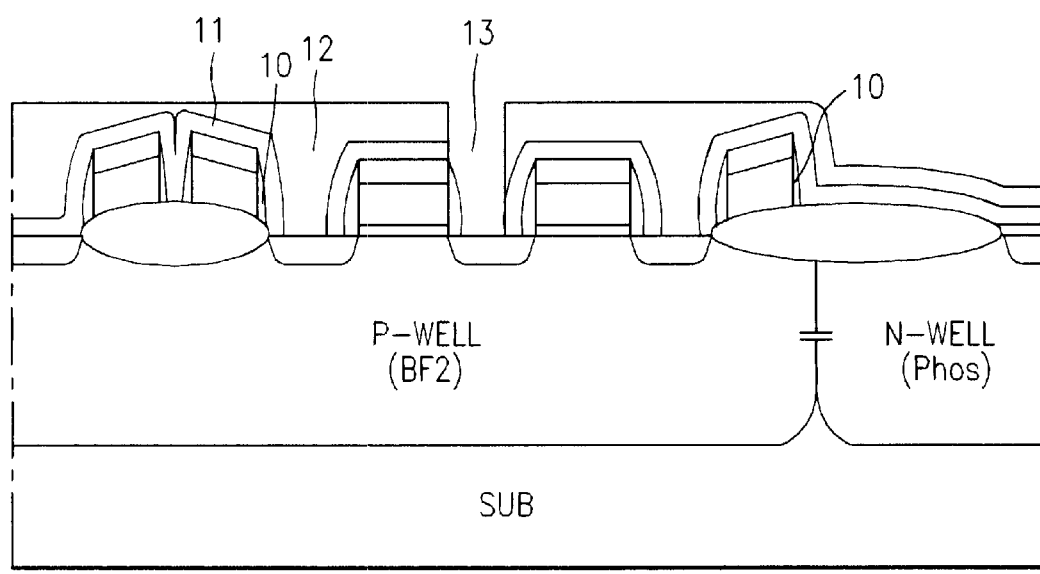
Figure 1G:
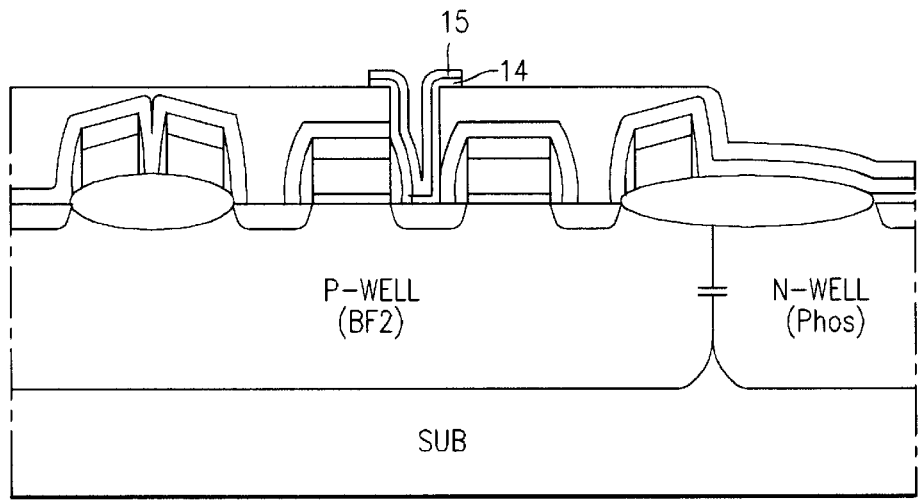
Figure 1H:
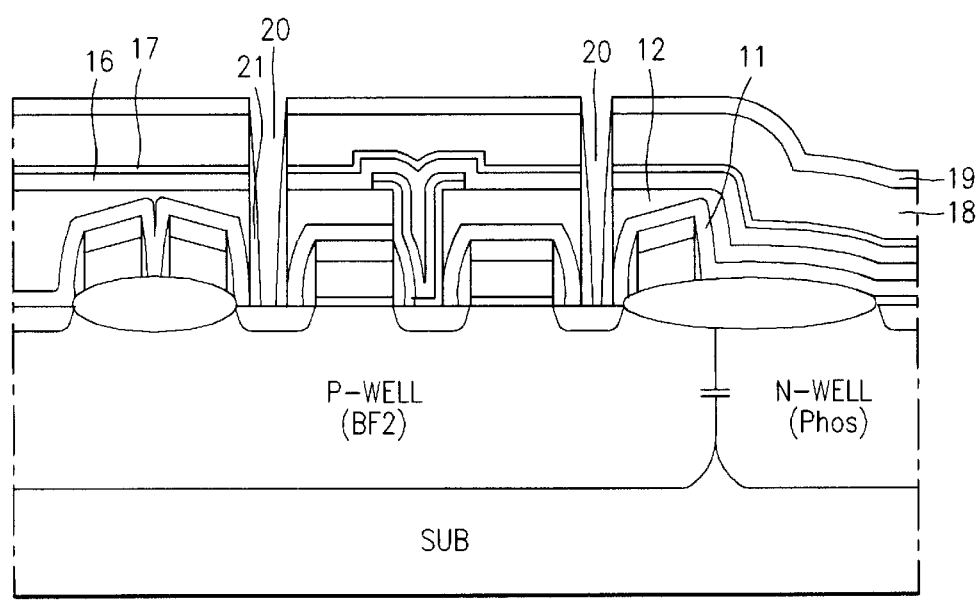
Figure 1I:
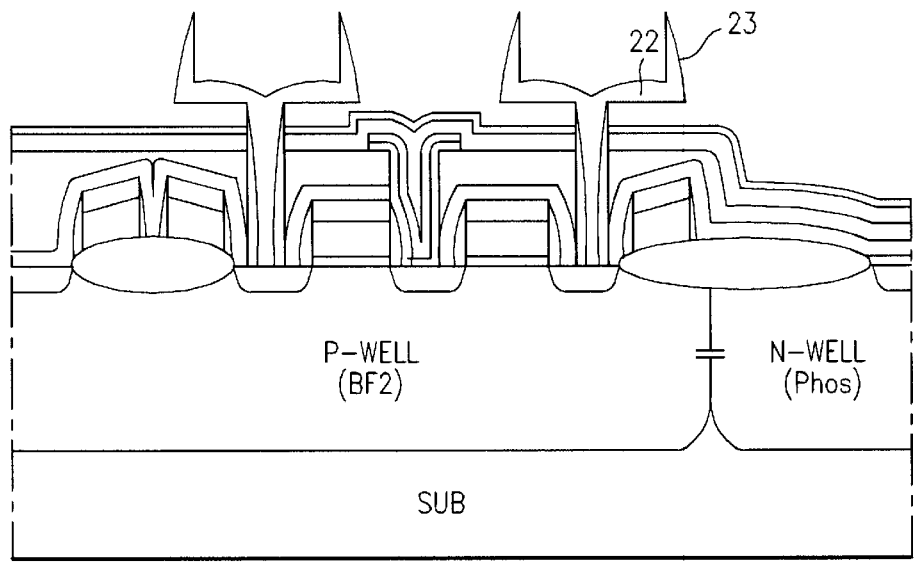
Figure 1J:
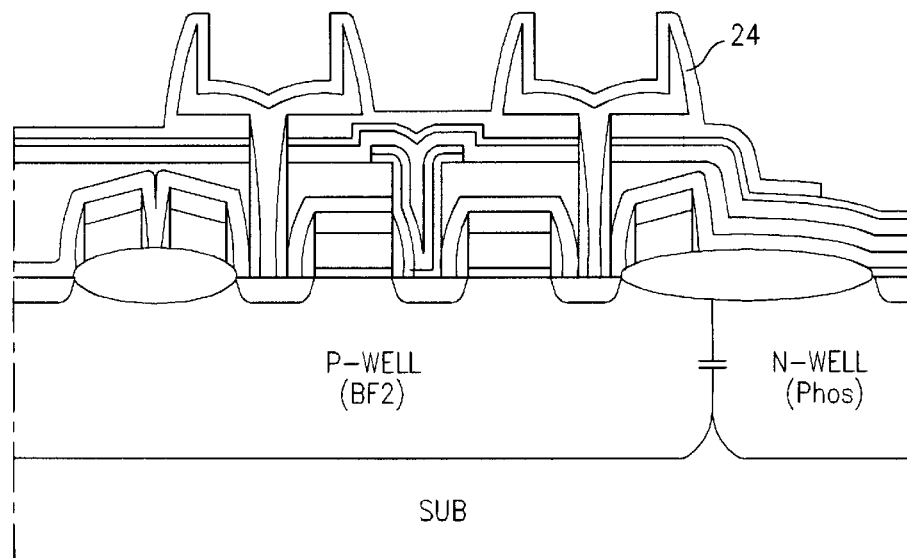
Figure 1K:
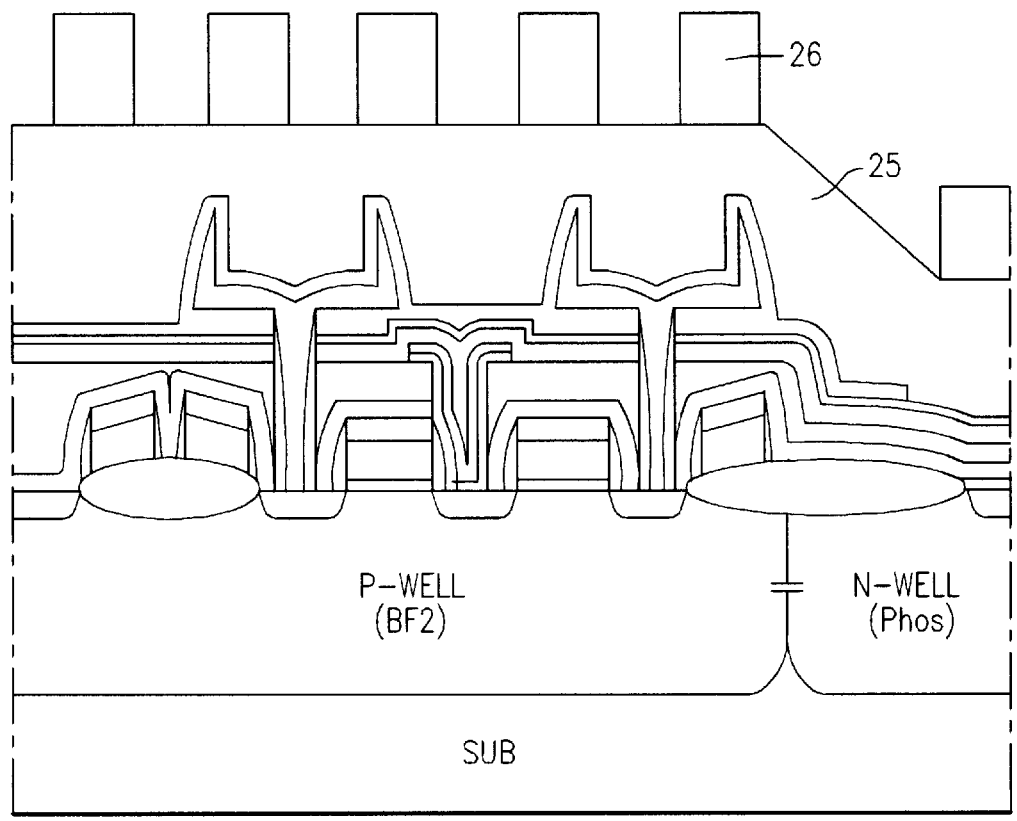
Figure 1L:
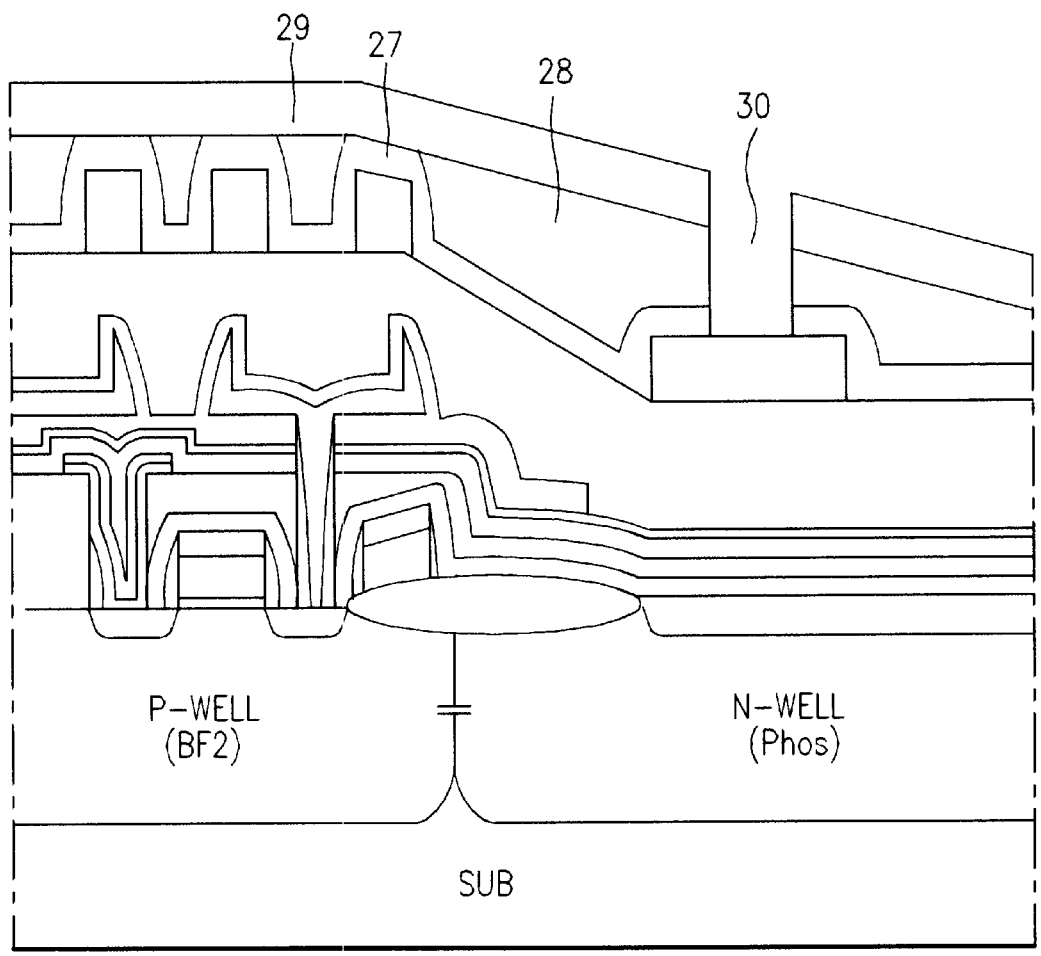
Figure 1M:
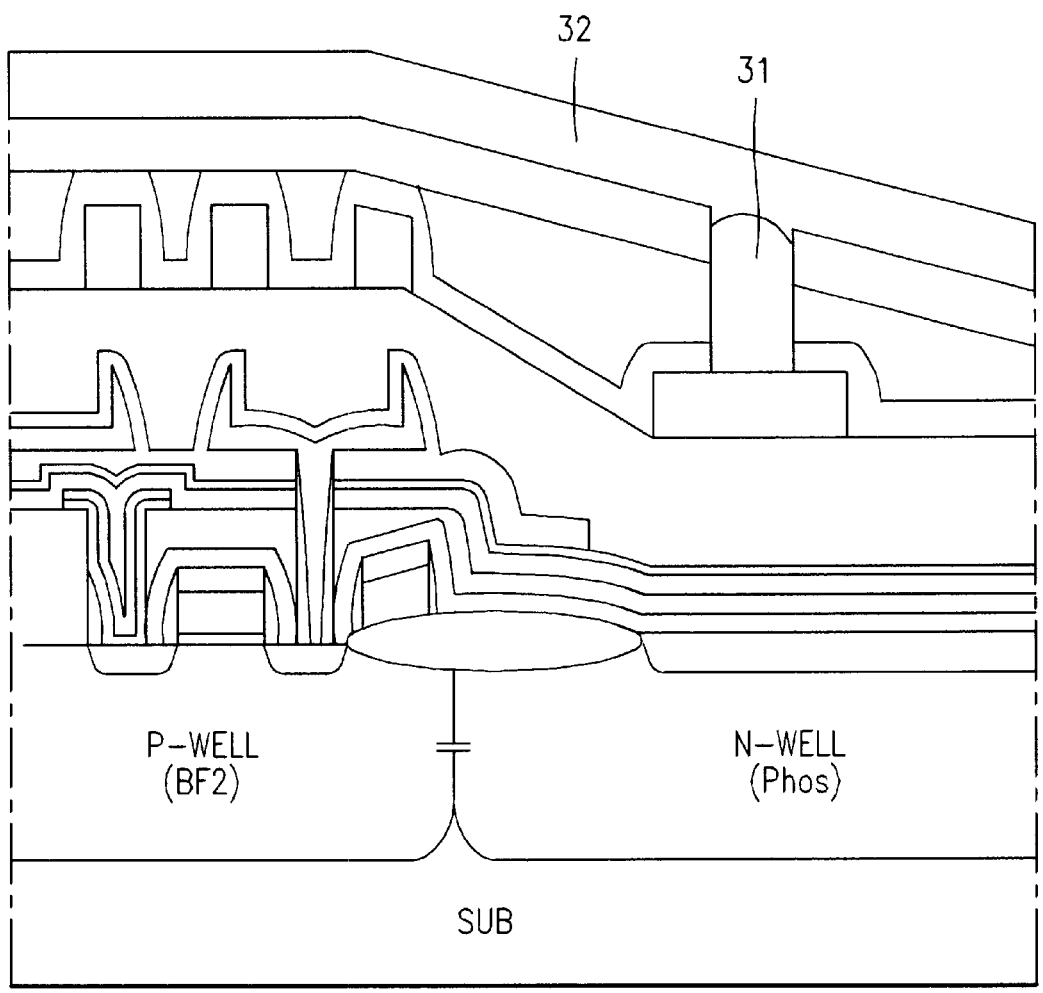
Figure 2A:
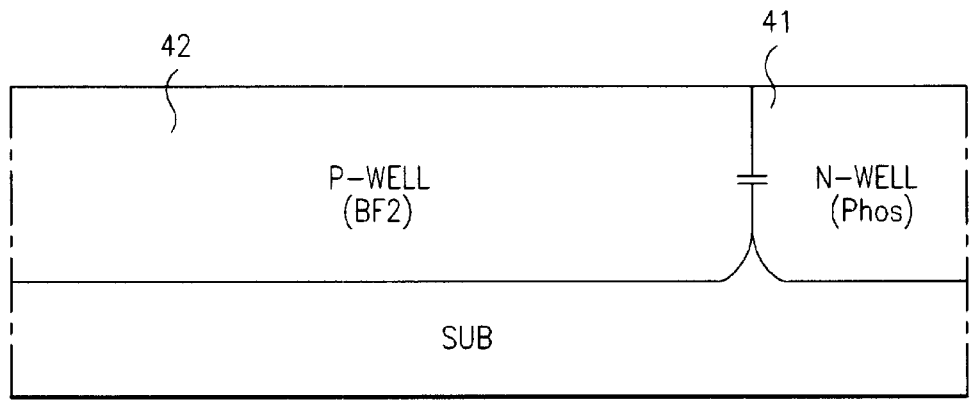

Referring to FIG. 2A, an n-type well 41 and a p-type well 42 are formed in a semiconductor substrate.

Figure 2B:
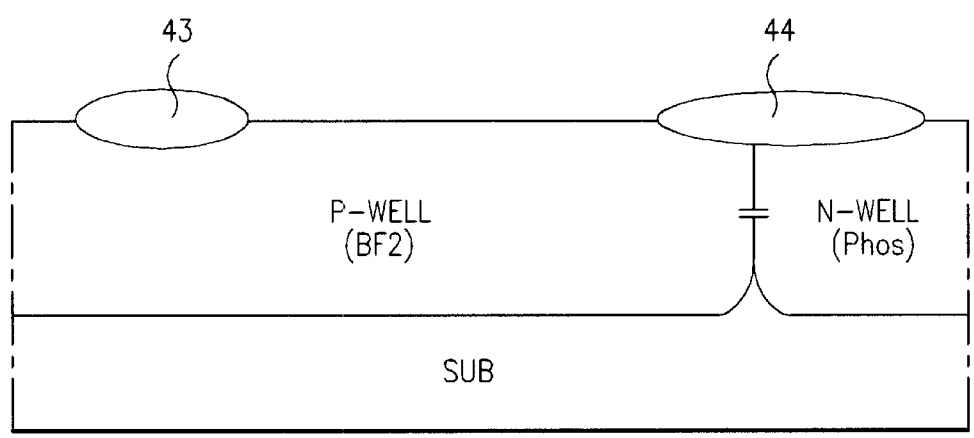
Figure 2C:
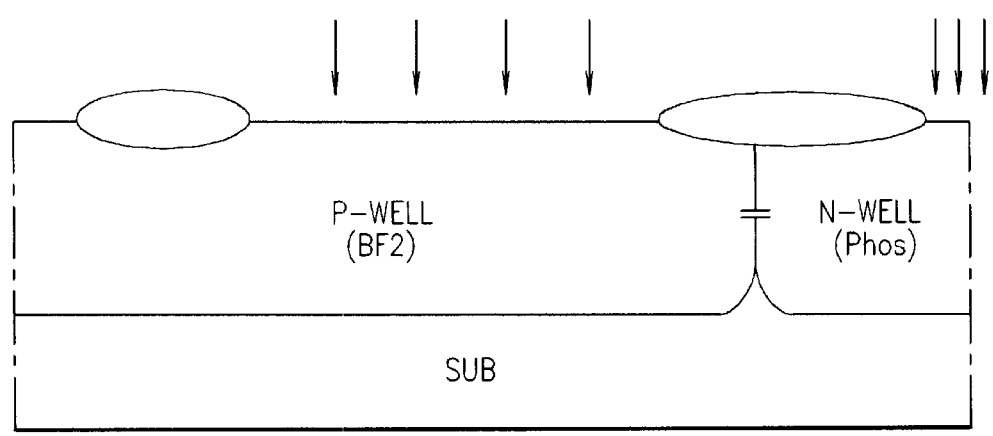

In FIG. 2B, an isolation layer 44 for isolating a cell array region from a periphery circuit region on predetermined portions of the substrate, and a device isolation layer 43 for isolating a cell from another are formed on the wells, respectively.

In order to adjust a device threshold voltage, an ion implantation process is performed into an active region defined by the layers 43 and 44 as shown in FIG. 4C. At this time, the type of transistor, such as an NMOS transistor or a PMOS transistor, determines the types of ions to be implanted into the active region.

Figure 2D:
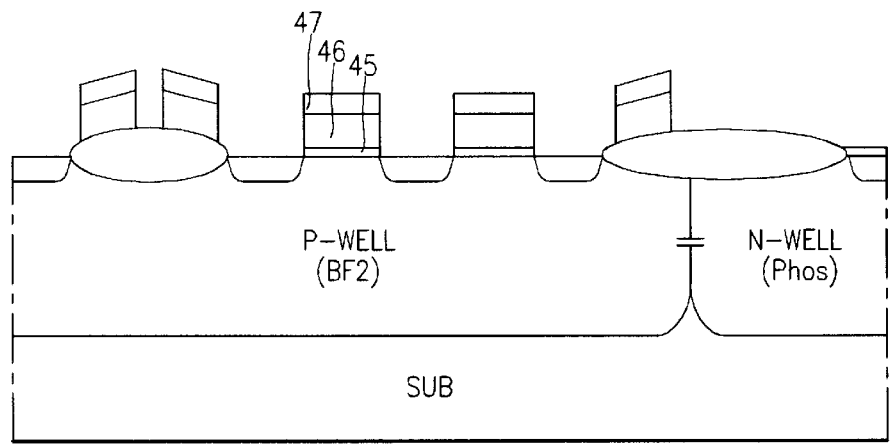

Referring to FIG. 2D, a word-line of a memory device is formed in the cell part. A gate for a periphery circuit is also formed in the periphery circuit region. The word-line includes a gate insulating layer 45, a polygate 46, and a cap oxide layer 47.

Figure 2E:
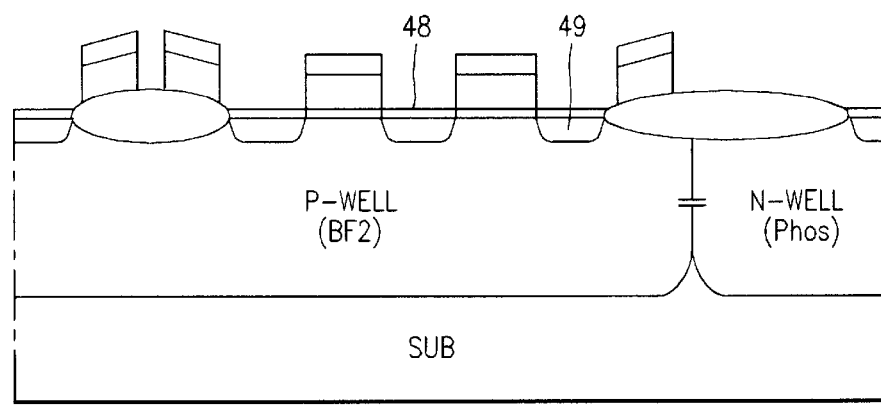

In FIG. 2E, a buffer oxide layer 48 is formed on the semiconductor substrate excluding the cell transistors. The buffer oxide layer 48 relieves stress generated on the substrate during the ion implantation process. With the gate insulating layer 45, the polygate 46, and the cap oxide layer 47 serving as masks, ions are implanted to form lightly-doped impurity diffusion regions 49 for a source and a drain.

Figure 2F:
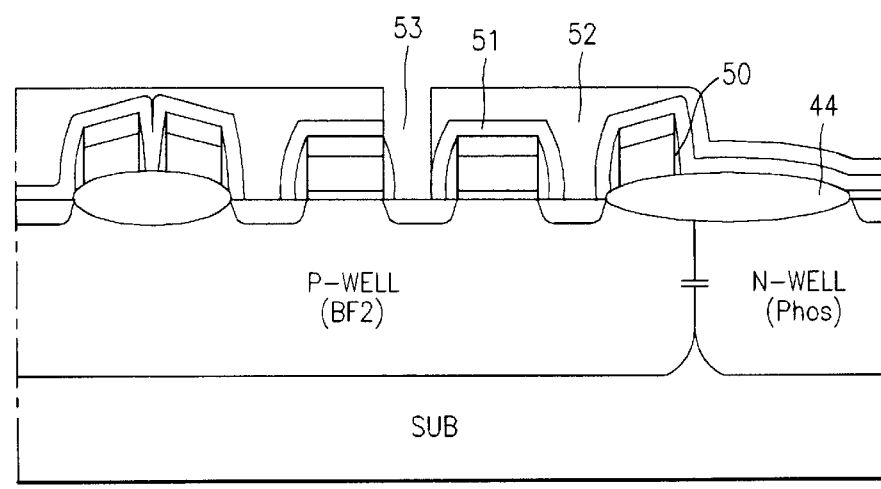

Referring to FIG. 2F, sidewall oxide layer 50 is formed on both sides of the gates 45, 46, and 47. With the sidewall oxide layer 50 and the gates serving as masks, a heavily doped ion implantation process is performed to form impurity diffusion regions having a LDD structure. Subsequently, a first insulating layer 51 is formed on the entire surface of the substrate where the cell transistors have been formed. At this time, transistors constituting the periphery circuit are also formed on the device isolation layer 44 for isolating the cell array region from the periphery circuit region. Accordingly, the step coverage between the cell array region and the periphery circuit region is reduced in the present invention.

A second insulating layer 52 of BPSG is formed on the first insulating layer 51 and then a portion of the first and second insulating layers 51 and 52 on one of the impurity diffusion regions are selectively removed to form a bit-line contact hole 53.

Referring to FIG. 2G, after a polysilicon layer 54 doped with an n-type impurity, and a tungsten silicide layer 55 are formed to completely bury the bit-line contact hole 53, they are selectively patterned to form a bit-line. At this time, the polysilicon layer 54 and the tungsten silicide layer 55 over a boundary portion between the cell array region and the periphery circuit region remain as a dummy pattern to prevent generation of the step coverage.

A third insulating layer 56 of oxide is formed on the entire surface including the bit-line as shown in FIG. 2H, and a fourth insulating layer 57 of nitride is then deposited on the third insulating layer 56. A fifth insulating layer 58 of BPSG is formed on the fourth insulating layer 57, and a sixth insulating layer 59 of oxide is then formed thereof. Thereafter, portions of the insulating layers 59, 58, 57, 56, 52, and 51 are partially removed over the other one of the impurity diffusion regions to form a storage node contact hole 60. Subsequently, a nitride sidewall 61 is formed on both sides of the storage node contact hole 60.

Figure 2I:
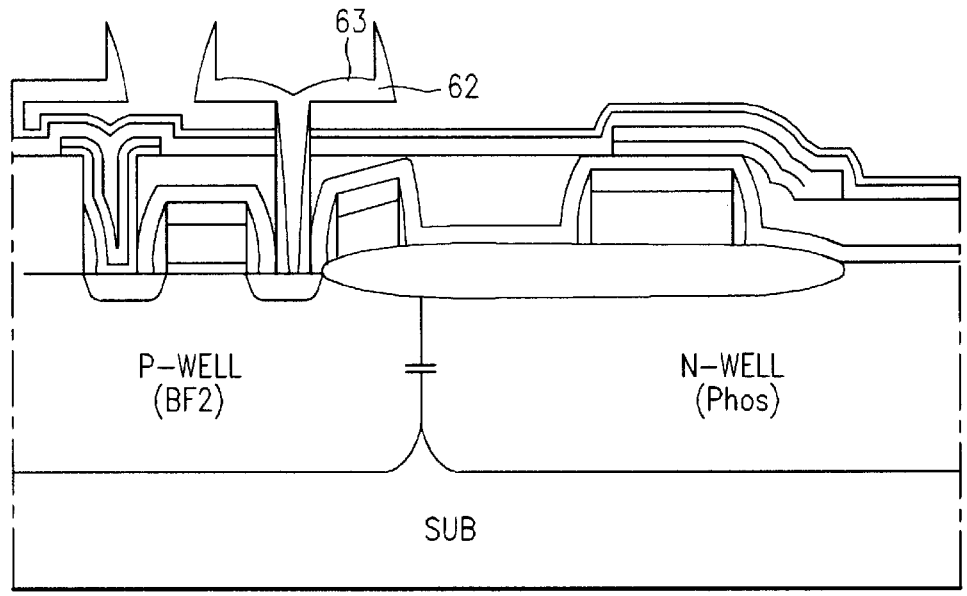

Referring to FIG. 2I, a storage node electrode 62 is formed to contact the impurity diffusion region exposed by the storage node contact hole 60, and then the fifth and sixth insulating layers are removed with wet-etching. Next, a high dielectric layer 63 is formed on the surface of the storage node electrode 62.

Figure 2J:
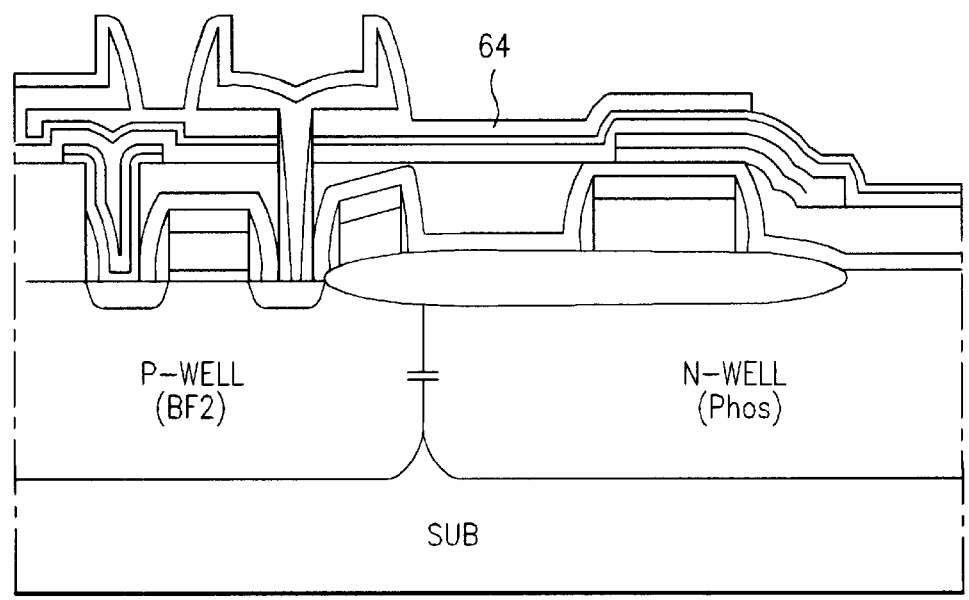

In FIG. 2J, a plate electrode 64 is formed on the storage node electrode 62 where the high dielectric layer 63 has been already formed.

Figure 2K:
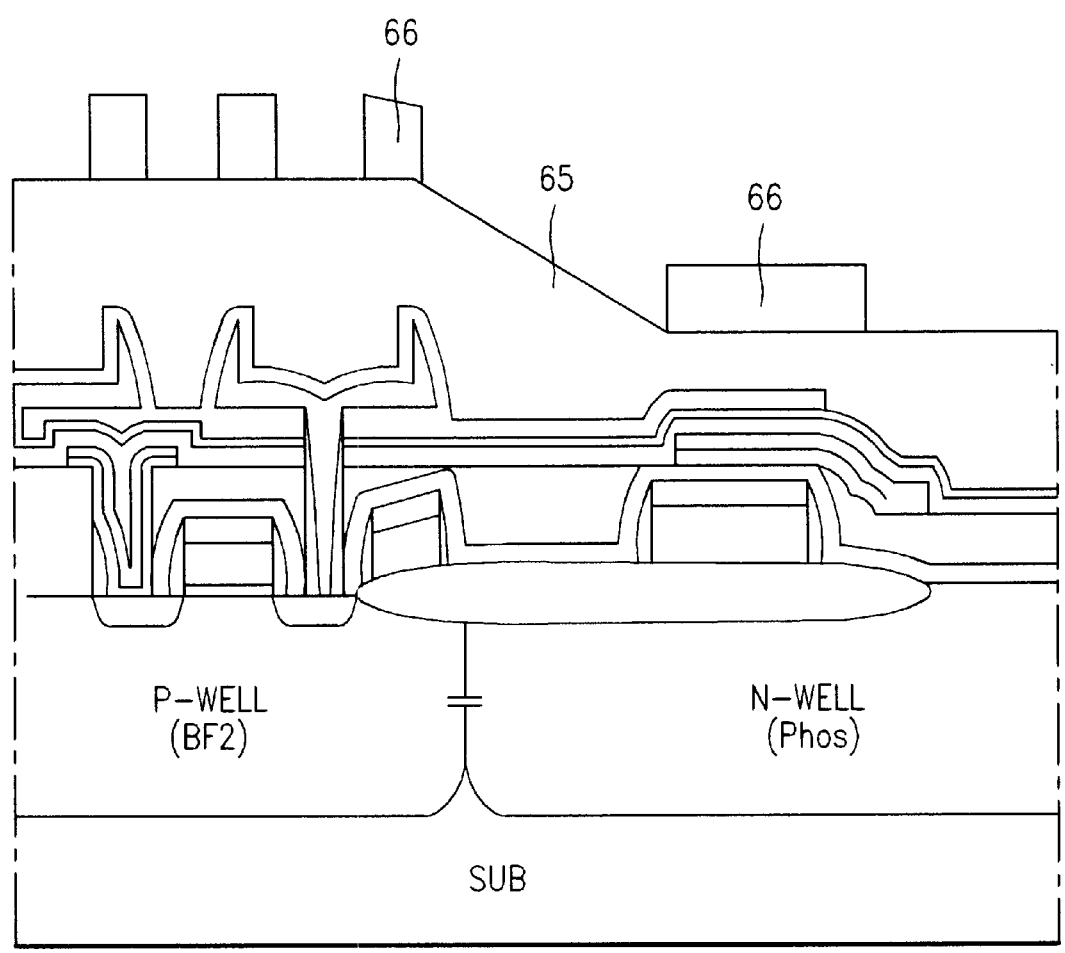

Referring to FIG. 2K, a seventh insulating layer 65 of oxide for multi-wiring is formed on the entire surface. Next, aluminum/anti-reflection layers are formed on the seventh insulating layer 65 and then selectively etched to form lower wiring layers 66. At this time, transistors and wiring layers are also formed in the periphery circuit part.

In FIG. 2L, an interlayer insulating layer 67 is formed on the entire surface including the lower wiring layers 66, and SOG layer 68 is then formed thereof and etched-back, thereby improving the step coverage characteristics. Subsequently, an eighth insulating layer 69 of oxide is formed on the SOG layer 68. Thereafter, the eighth insulating layer 69, the SOG layer 68, and the interlayer insulating layer 67 are partially removed to expose the lower wiring layer 66 to form an interlayer contact hole 70.

Figure 2M:
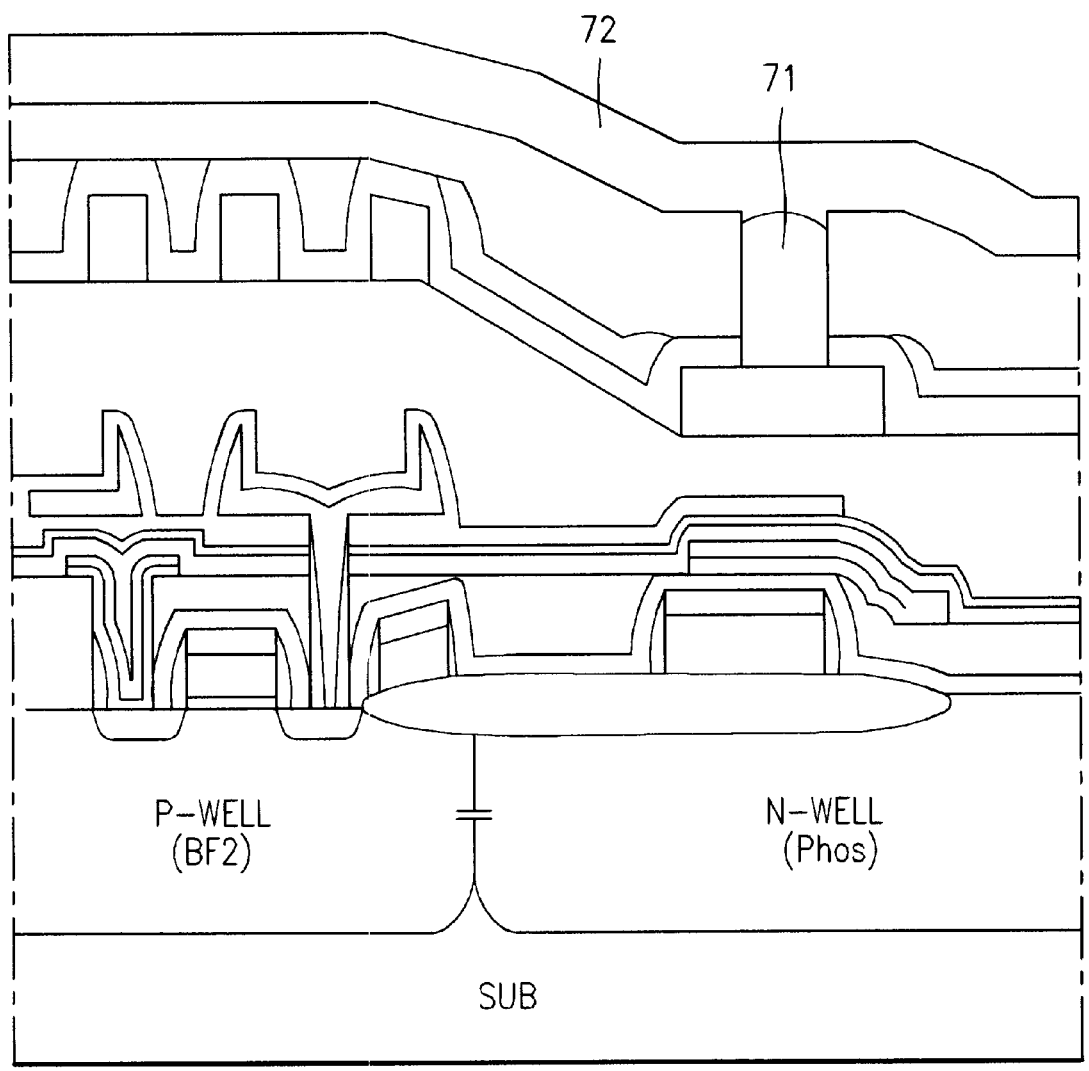

Referring to FIG. 2M, a plug layer 71 is formed in the interlayer contact hole 70 to improve the electrical characteristics of wiring. Next, an upper wiring layer 72 made of aluminum/anti-reflection layers is formed to contact the plug layer 71. In order to reduce the step coverage between the cell array region and the periphery circuit region (positioned lower than the cell array region), a dummy pattern layer is formed at the boundary region between the cell array region and the periphery circuit region. In particular, when the gate-line and the bit-line are formed on the cell array region, a portion of the gate-line and bit-line remains as dummy lines on the boundary region between the cell array region and periphery circuit region, so that the process of forming metal wirings is facilitated by reducing the step coverage.

A semiconductor memory device and a method of fabricating the same of the present invention have the following advantages.

Since a dummy pattern layer of a gate line and a bit-line remains on the device isolation layer at the boundary region between a cell array region and a periphery circuit region (positioned lower than the cell array region), generation of step coverage is much reduced. Accordingly, even though a capacitor of a COB structure is formed in the cell array region, the step coverage between the cell array region and the periphery circuit region is not significant. As a result, the metal wirings are precisely defined in patterning the metal wirings on the periphery circuit region as well as on the cell array region.

Further, since the SOG layer is not exposed through the interlayer contact hole, the corrosion of a plug layer is not caused by the absorption of moisture from the SOG layer, thereby preventing the degradation of the electrical characteristics at the connection portion of the upper and lower wirings.

It will be apparent to those skilled in the art that various modifications and variations can be made in the semiconductor memory device and the method of fabrication the same of the present invention without departing from the spirit or scope of the inventions. Thus, it is intended that the present invention cover the modifications and variations of this invention provided they come within the scope of the appended claims and their equivalents.

What is claimed is:

1. A method of fabricating a semiconductor memory device having a substrate, the method comprising the steps of:

forming first and second isolation layers on the substrate, the first isolation layer isolating a cell from other cells and the second isolation layer isolating a cell array region from a periphery circuit region;

forming a plurality of word-lines on the cell array region and the periphery circuit region including the first and second isolation layers;

forming first and second impurity diffusion regions on the semiconductor substrate;

forming first and second bit-lines over the cell array region and the periphery circuit region, respectively, the first bit-line contacting the first impurity region and the second bit-line overlapping the word-line on the second isolation layer;

forming an insulting layer on an entire surface including the bit-lines;

forming a contact hole to expose the second impurity diffusion region; and forming a capacitor to contact the second impurity diffusion region.

2. The method according to claim 1, wherein the step of forming a plurality of word-lines includes the steps of:

forming a gate insulating layer on the semiconductor substrate;

forming a polygate on the gate insulating layer;

forming a cap oxide layer on the polysilicon layer;

selectively removing the gate insulating layer, the polysilicon layer, and the cap oxide layer to expose a portion of the substrate.

3. The method according to claim 1, wherein the step of forming first and second bit-lines include the steps of:

forming a polysilicon layer on an entire surface of the substrate including the first impurity diffusion regions;

forming a tungsten silicide layer on the polysilicon layer; and selectively removing the polysilicon layer and the tungsten silicide layer to form the first and second bit-lines.

4. The method according to claim 1, wherein the second bit-line is formed on the second isolation layer.

5. The method according to claim 1, wherein the second bit-line is a dummy pattern layer.

6. A method of fabricating a semiconductor memory device having a semiconductor substrate, the method comprising the steps of:

forming first and second conductivity type wells in the semiconductor substrate;

forming a first isolation layer on the first conductivity type well and a second isolation layer at a boundary of the first and second conductivity type wells;

implanting first impurity ions into the wells;

forming a plurality of word-lines on the wells including the second isolation layer;

implanting second impurity ions into the wells to define first and second impurity regions;

forming a first bit-line to contact the first impurity region and a second bit-line at the second isolation layer, the word-line on the second isolation layer overlapping the second bit-line;

forming a first insulating layer on an entire surface of the substrate including the first and second bit-lines.

7. The method according to claim 6, further comprising the steps of:

forming a wiring layer on the first insulating layer;

forming an interlayer insulating layer on the wiring layer;

forming a spin on glass (SOG) layer on the interlayer insulating layer;

forming a second insulating layer on the SOG;

forming a contact hole in the second insulating layer; and forming a plug layer on the wiring layer through the contact hole, the plug layer not contacting the SOG layer.

8. The method according to claim 6, further comprising a step of implanting third impurity ions into the first impurity region to form a lightly doped drain (LDD) region.

9. The method according to claim 6, wherein the step of implanting first impurity ions is for adjusting a device threshold voltage.

10. The method according to claim 6, wherein the word-lines include a gate insulating layer, polygate, and cap oxide layer.

11. The method according to claim 6, wherein the first and second bit-lines include a polysilicon layer and a tungsten silicide layer.

12. The method according to claim 7, wherein the wiring layer includes an aluminum/anti-reflection layer.

* * * * *